(12) United States Patent
Zeng

(10) Patent No.: US 10,699,657 B2
(45) Date of Patent: Jun. 30, 2020

(54) BIDIRECTIONAL SCANNING GATE DRIVE CIRCUIT AND LIQUID CRYSTAL DISPLAY PANEL

(71) Applicant: Shenzhen China Star Optoelectronics Technology Co., Ltd., Shenzhen, Guangdong (CN)

(72) Inventor: Mian Zeng, Guangdong (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 258 days.

(21) Appl. No.: 15/500,150

(22) PCT Filed: Jan. 19, 2017

(86) PCT No.: PCT/CN2017/071626
§ 371 (c)(1),
(2) Date: Dec. 7, 2017

(87) PCT Pub. No.: WO2018/040490
PCT Pub. Date: Mar. 8, 2018

(65) Prior Publication Data
US 2018/0218700 A1 Aug. 2, 2018

(30) Foreign Application Priority Data
Aug. 31, 2016 (CN) .......................... 2016 1 0794038

(51) Int. Cl.
*G11C 19/00* (2006.01)
*G09G 3/36* (2006.01)
*G11C 19/28* (2006.01)

(52) U.S. Cl.
CPC ... *G09G 3/3677* (2013.01); *G09G 2310/0283* (2013.01); *G09G 2310/0286* (2013.01); *G11C 19/28* (2013.01)

(58) Field of Classification Search
None
See application file for complete search history.

(56) References Cited

U.S. PATENT DOCUMENTS 4,342,045 A * 7/1982 Kim .................... H01L 27/0251
257/360
4,734,752 A * 3/1988 Liu ..................... H01L 27/0222
257/357
(Continued)

FOREIGN PATENT DOCUMENTS

CN 203300196 11/2013
CN 104269151 1/2015
(Continued)

OTHER PUBLICATIONS

Search Report and Written Opinion, dated Apr. 5, 2017, for International Application No. PCT/CN2017/071626.
(Continued)

*Primary Examiner* — Tuan T Lam

(57) ABSTRACT

Disclosed is a bidirectional scanning gate drive circuit and a liquid crystal display panel. The technical problem to be solved is that gate drive circuits in the prior art are provided with only one drive mode. The bidirectional scanning gate drive circuit includes an input part, a control part, and an output part. Signals enter the control part from the input part and then enter the output part or signals enter the control part from the output part and then enter the input part, so as to realize driving of a horizontal scanning line in an $N^{th}$ stage.

12 Claims, 2 Drawing Sheets

(56) References Cited

U.S. PATENT DOCUMENTS

| | | | | |
|---|---|---|---|---|
| 5,521,415 | A * | 5/1996 | Kondo | H01L 27/0251 257/355 |
| 7,636,412 | B2 * | 12/2009 | Tobita | G11C 19/28 377/64 |
| 8,014,488 | B2 * | 9/2011 | Jang | G11C 19/00 377/64 |
| 2008/0158204 | A1 | 7/2008 | Chang et al. | |
| 2012/0280967 | A1 * | 11/2012 | Miyamoto | G11C 19/28 345/212 |
| 2012/0286855 | A1 * | 11/2012 | Umezaki | G09G 3/20 327/538 |
| 2014/0133621 | A1 * | 5/2014 | Shang | G11C 19/184 377/67 |
| 2014/0168050 | A1 * | 6/2014 | Gu | G09G 3/3611 345/100 |
| 2016/0125955 | A1 * | 5/2016 | Pang | G11C 19/287 377/64 |
| 2017/0076683 | A1 * | 3/2017 | Lee | G11C 19/28 |

FOREIGN PATENT DOCUMENTS

| | | |
|---|---|---|
| CN | 104318908 | 1/2015 |
| CN | 104376824 | 2/2015 |
| CN | 104537991 | 4/2015 |
| CN | 106205539 | 12/2016 |

OTHER PUBLICATIONS

Office Action and Search Report, dated Oct. 9, 2017, for Chinese Patent Application No. 201610794038.X.

* cited by examiner

BIDIRECTIONAL SCANNING GATE DRIVE CIRCUIT AND LIQUID CRYSTAL DISPLAY PANEL

CROSS-REFERENCE TO RELATED APPLICATIONS

The present application claims the priority of Chinese patent application CN 201610794038.X, entitled "Bidirectional scanning gate drive circuit and liquid crystal display panel" and filed on Aug. 31, 2016, the entirety of which is incorporated herein by reference.

FIELD OF THE INVENTION

The present disclosure relates to the technical field of LCD (liquid crystal display)-device manufacturing, and in particular, to a gate drive circuit which realizes bidirectional scanning by way of changing input signals and a LCD panel which comprises the bidirectional scanning gate drive circuit.

BACKGROUND OF THE INVENTION

At present, thin film transistor liquid crystal display (TFT-LCD) devices, as a main flat-panel display device in the existing technologies, have become an important display platform of modern IT products and video products. LCD devices are widely used in all kinds of electronic products. During the manufacturing process of LCD devices, there is an important technology called Gate Driver On Array (GOA) technology. GOA technology aims to realize line-by-line scanning of a gate drive circuit by providing a line-scanning drive signal circuit of a gate drive circuit on an array substrate of a LCD panel. This gate drive circuit integrated on an array substrate by means of GOA technology is called a GOA gate drive circuit or a GOA circuit.

An existing GOA circuit usually comprises multiple stages of GOA units that are cascaded. A GOA unit in each stage drives a horizontal scanning line in a corresponding stage. A GOA unit mainly comprises a pull-up part, a pull-up control part, a transfer part, a key pull-down part, a pull-down holding part, and a bootstrap capacitor configured to increase an electrical potential.

The pull-up part is mainly configured to output a clock signal as a gate drive signal. The pull-up control part is configured to control the on-state time of the pull-up part and is generally connected with a transfer signal or a gate drive signal (for short, a gate signal) transmitted from a previous-stage GOA circuit. The key pull-down part is configured to pull down the gate drive signal to a low level, that is, to turn off the gate drive signal. The pull-down holding part is configured to hold an output signal of the gate drive signal and the gate drive signal (usually called Q point) of the pull-up part in an off state (i.e. in a negative level). Usually there are two pull-down holding parts working alternately. The bootstrap capacitor is responsible for a secondary pulling-up of Q point, which is conducive to an output of G(N) of the pull-up part.

FIG. 1 schematically shows a GOA circuit in the prior art. As shown in FIG. 1, an $N^{th}$-stage GOA unit is configured to charge an N-stage horizontal scanning line G(N) in an active area. The $N^{th}$-stage GOA unit comprises a pull-up control part 100, a pull-up part 200, a transfer part 300, a bootstrap capacitor 400, a key pull-down part 500, a first pull-down holding part 600, and a second pull-down holding part 700.

The pull-up control part 100 comprises a TFT T11. A gate of the TFT T11 is configured to input a transfer signal ST(N−1) of an $(N−1)^{th}$-stage GOA unit, and a drain and a source thereof are respectively connected with a horizontal scanning line G(N−1) in an $(N−1)^{th}$ stage and a gate signal point Q(N). The pull-up part 200 comprises a TFT T21. A gate and a source of the TFT T21 are respectively connected with the gate signal point Q(N) and a horizontal scanning line G(N) in an $N^{th}$ stage, and a drain thereof is configured to input a clock signal CK. The transfer part 300 comprises a TFT T22. A gate of the TFT T22 is connected with the gate signal point Q(N), and a drain and a source thereof are configured to respectively input the clock signal CK and output a transfer signal ST(N). The key pull-down part 500 comprises a TFT T31 and a TFT T41. A gate and a drain of the TFT T31 are respectively connected with a horizontal scanning line G(N+1) in an $(N+1)^{th}$ stage and the horizontal scanning line G(N) in the $N^{th}$ stage, and a source thereof is configured to input a direct-current (DC) low voltage VSS. A gate and a drain of the TFT T41 are respectively connected with the horizontal scanning line G(N+1) in the $(N+1)^{th}$ stage and the gate signal point Q(N), and a source thereof is configured to input the direct-current low voltage VSS.

The pull-down holding part comprises two mirroring pull-down holding parts, a first pull-down holding part 600, and a second pull-down holding part 700.

During working, a first clock signal LC1 and a second clock signal LC2 both have a frequency lower than that of the clock signal CK inputted into the pull-up part 200 and a first circuit point K(N) and a second circuit point P(N) are configured to be at a high level alternately, so that the two pull-down holding parts work alternately. By way of this, TFTs of the two pull-down holding parts are protected from constant DC-stress and negative effects resulted therefrom can thus be alleviated.

Yet, the existing shift registers allows scanning only in a specific direction (e.g. drive gate lines G(1) to G(N) in turn by way of forward scanning) and are not able to support other drive modes. As the existing shift registers are provided with only one drive mode, LCD panels are restricted in use.

SUMMARY OF THE INVENTION

Gate drive circuits in the prior art allows scanning only in a specific direction and are not able to support other drive modes. As the existing gate drive circuits are provided with only one drive mode, LCD panels are restricted in use. Regarding the above technical problem, the present disclosure provides a bidirectional scanning gate drive circuit and a LCD panel.

According to one aspect of the present disclosure, a bidirectional scanning gate drive circuit is provided. The bidirectional scanning gate drive circuit comprises multiple stages of GOA units that are cascaded. A GOA unit in each stage is configured to drive a horizontal scanning line in a corresponding stage, and a GOA unit comprises an input part, a control part, and an output part. The input part is configured to receive a transfer signal of an $(N−1)^{th}$-stage GOA unit, receive a high-level direct-current signal during forward scanning, receive a low-level direct-current signal during backward scanning, and output a gate drive signal. The control part is configured to receive the gate drive signal and a clock signal, output a transfer signal of an $N^{th}$-stage GOA unit, and drive an $N^{th}$-stage horizontal scanning line. The output part is configured to receive the gate drive signal and an inputted transfer signal of an $(N+1)^{th}$-stage GOA unit, receive a low-level direct-current signal during forward scanning, and receive a high-level direct-current signal during backward scanning, so as to realize driving of the $N^{th}$-stage horizontal scanning line.

Preferably, the control part is further configured to hold the $N^{th}$-stage horizontal scanning line in an off state.

Preferably, the output part comprises a switch element T41 and a switch element T31. The switch element T41 is configured to receive the gate drive signal and the inputted transfer signal of the $(N+1)^{th}$-stage GOA unit, receive a low-level direct-current signal during forward scanning, and receive a high-level direct-current signal during backward scanning. The switch element T31 is configured to receive another low-level direct-current signal and drive the $N^{th}$-stage horizontal scanning line.

Preferably, a key pull-down part comprises a switch element T41 and a switch element T31. The switch element T41 is configured to receive the gate drive signal and the inputted transfer signal of the $(N+1)^{th}$-stage GOA unit, receive a low-level direct-current signal during forward scanning, and receive a high-level direct-current signal during backward scanning. The switch element T31 is configured to receive another low-level direct-current signal and drive the $N^{th}$-stage horizontal scanning line.

Preferably, a gate of the switch element T41 is connected with a transfer signal input terminal of the $(N+1)^{th}$-stage GOA unit, a drain thereof is connected with a gate drive signal output terminal of a pull-up control part, and a source thereof is connected with a low-level direct-current signal input terminal during forward scanning and connected with a high-level direct-current signal input terminal during backward scanning. A source of the switch element T31 is connected with another low-level direct-current signal input terminal and a gate thereof is connected with a drain thereof and configured as an input terminal of the $N^{th}$-stage horizontal scanning line.

Preferably, the input part comprises a switch element T11. A gate of the switch element T11 is connected with a transfer signal input terminal of the $(N-1)^{th}$-stage GOA unit, a source thereof is configured as a gate drive signal output terminal of the input part, and a drain thereof is connected with a high-level direct-current signal input terminal during forward scanning and connected with a low-level direct-current signal input terminal during backward scanning.

Preferably, the switch element T41 and the switch element T31 are both metal-oxide-semiconductor field-effect transistors (MOSFET).

Preferably, the switch element T11 is a metal-oxide-semiconductor field-effect transistor (MOSFET).

According to another aspect of the present disclosure, a LCD panel is provided. The LCD panel comprises bidirectional shift registers in each of the above preferred embodiments.

Preferably, the bidirectional scanning gate drive circuit can realize a forward scanning mode and a backward scanning mode.

Preferably, while the bidirectional scanning gate drive circuit realizes a forward scanning mode, a flow of signals is as follows: the transfer signal of the $(N-1)^{th}$-stage GOA unit → the transfer signal of the $N^{th}$-stage GOA unit → the transfer signal of the $(N+1)^{th}$-stage GOA unit.

Preferably, while the bidirectional scanning gate drive circuit realizes a backward scanning mode, a flow of signals is as follows: the transfer signal of the $(N+1)^{th}$-stage GOA unit → the transfer signal of the $N^{th}$-stage GOA unit → the transfer signal of the $(N-1)^{th}$-stage GOA unit.

Compared with the prior art, the above technical solutions of the present disclosure have the following advantages or beneficial effects.

Gate drive circuits in the prior art allows scanning only in a specific direction and are not able to support other drive modes. As the existing gate drive circuits are provided with only one drive mode, LCD panels are restricted in use. The bidirectional scanning gate drive circuit and the LCD panel provided by the present disclosure enable a LCD panel to work normally under a forward scanning mode and a backward scanning mode, which provides flexible drive modes of a LCD panel and thus solves the above technical problem.

Minor changes are brought to the existing circuit. The present disclosure can realize two scanning modes, a forward scanning mode and a backward scanning mode, only by changing the connecting way of two elements and the inputting way of signals, which widens the use of LCD panels and provides flexible drive modes for LCD panels.

The above technical features can be combined in any suitable manner, or substituted by the equivalent technical features, as long as the purpose of the present disclosure can be achieved.

BRIEF DESCRIPTION OF THE DRAWINGS

The present disclosure will be illustrated in detail hereinafter with reference to the embodiments and the accompanying drawings. In the drawings.

DETAILED DESCRIPTION OF THE EMBODIMENTS

The present disclosure will be illustrated further with reference to the drawings.

Embodiment 1

Figure 1:
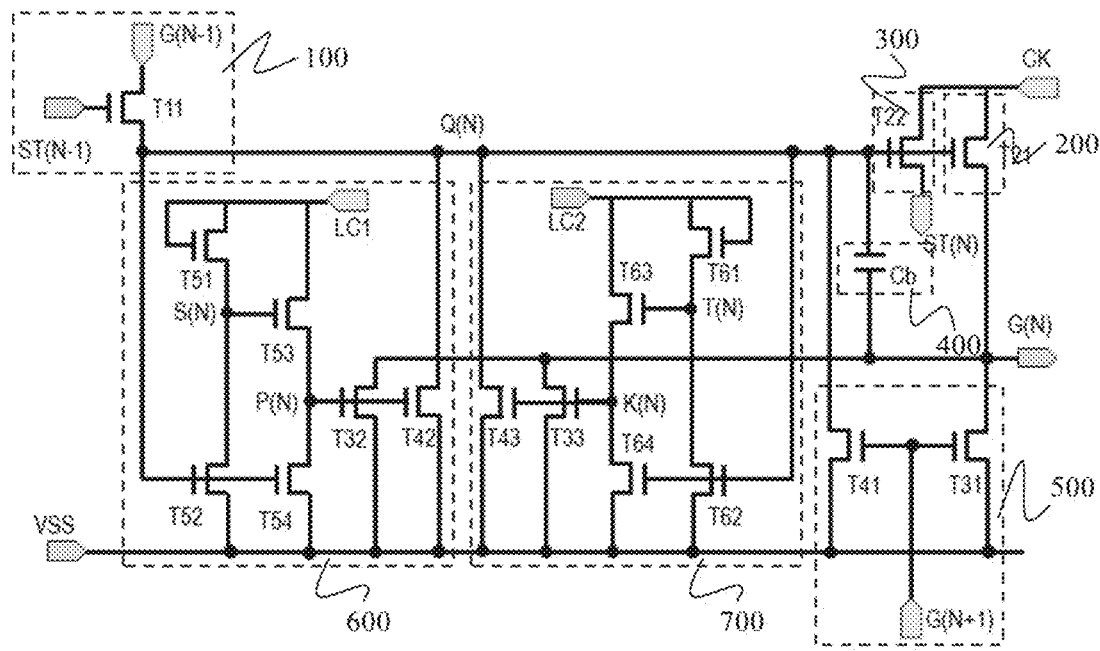
FIG. 1 schematically shows a GOA circuit in the prior art.
Figure 2:
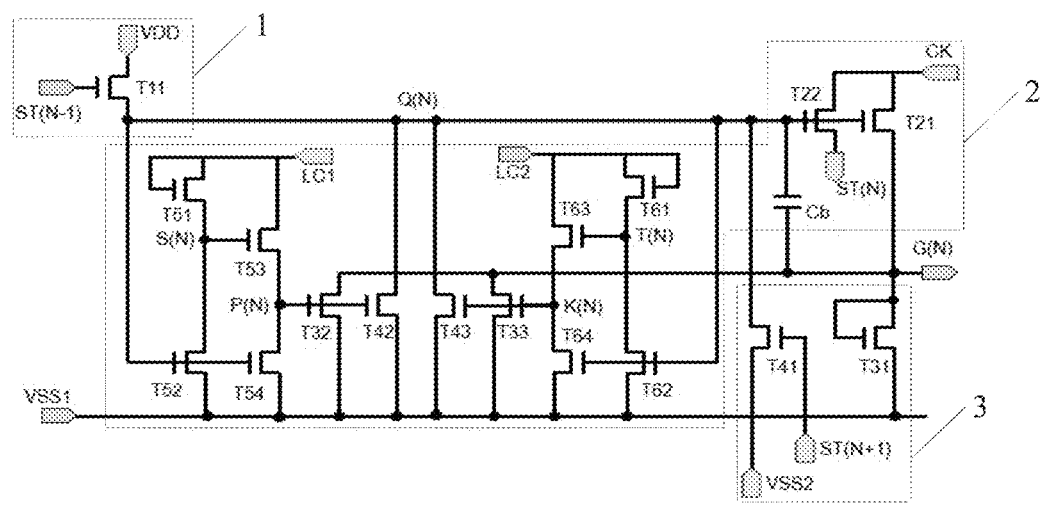
FIG. 2 schematically shows a gate drive circuit which realizes forward scanning in Embodiment 1 of the present disclosure.

FIG. 2 schematically shows a gate drive circuit which realizes forward scanning in Embodiment 1 of the present disclosure. The forward-scanning gate drive circuit is used to provide a forward scanning drive mode for a LCD panel. The forward-scanning gate drive circuit works on a LCD panel and enables a LCD panel to work normally under a forward scanning mode.

As shown in FIG. 2, the forward-scanning gate drive circuit in this embodiment comprises multiple stages of GOA units that are cascaded. A GOA unit in each stage drives a horizontal scanning line in a corresponding stage. In one preferred embodiment, GOA units in all stages in the forward-scanning gate drive circuit have a same structure.

Specifically, a GOA unit comprises an input part 1, a control part 2, and an output part 3.

A preferred structure of a gate drive circuit will be illustrated below with reference to the gate drive circuit which comprises an input part 1, a control part 2, and an output part 3.

A transfer signal of an $(N-1)^{th}$-stage GOA unit and a high-level direct-current signal are inputted into the input part 1 and a gate drive signal is finally outputted by the input part 1.

The gate drive signal outputted by the input part 1 enters the control part 2. A transfer signal of an $N^{th}$-stage GOA unit is outputted from an output terminal of the control part 2. The control part 2, with a structure the same as the existing structure (i.e. the structure of an existing GOA circuit), comprises a pull-up part, a transfer part, a bootstrap capacitor, a key pull-down part, a first pull-down holding part, and a second pull-down holding part.

The output part 3 is configured to receive the gate drive signal, a transfer signal of an $(N+1)^{th}$-stage GOA unit, and a direct-current low-level signal, so as to realize driving of a horizontal scanning line in an $N^{th}$ stage.

Signals of the gate drive circuit in a forward scanning mode flow as follows: the transfer signal of the $(N-1)^{th}$-stage GOA unit→ the transfer signal of the $N^{th}$-stage GOA unit→ the transfer signal of the $(N+1)^{th}$-stage GOA unit, by way of which a forward drive mode of a LCD panel is realized.

The working principle of the forward-scanning gate drive circuit in this embodiment will be illustrated below with reference to the forward-scanning gate drive circuit which comprises the input part 1, the control part 2, and the output part 3.

In order to drive a LCD device in a forward-scanning drive mode and to realize the forward drive mode of the LCD panel by way of a flow of signals along the forward-scanning drive circuit as follows: the transfer signal SN(N−1) of the $(N-1)^{th}$-stage GOA unit→ the transfer signal SN(N) of the $N^{th}$-stage GOA unit→ the transfer signal SN(N+1) of the $(N+1)^{th}$-stage GOA unit, the following steps are required. A high-level signal is inputted into the input part 1. The transfer signal of the $(N+1)^{th}$-stage GOA unit is inputted into a gate of a switch element T41 in the output part 3 and a low-level signal is inputted into a source thereof. Besides, a gate and a source of a switch element T31 are both connected with the horizontal scanning line in the $N^{th}$ stage. By way of this, signals are able to flow from the high-level direct-current signal to the low-level direct-current signal and thus a forward scanning mode in which signals flow as follows is formed: the transfer signal SN(N−1) of the $(N-1)^{th}$-stage GOA unit→ the transfer signal SN(N) of the $N^{th}$-stage GOA unit→ the transfer signal SN(N+1) of the $(N+1)^{th}$-stage GOA unit.

Figure 4:
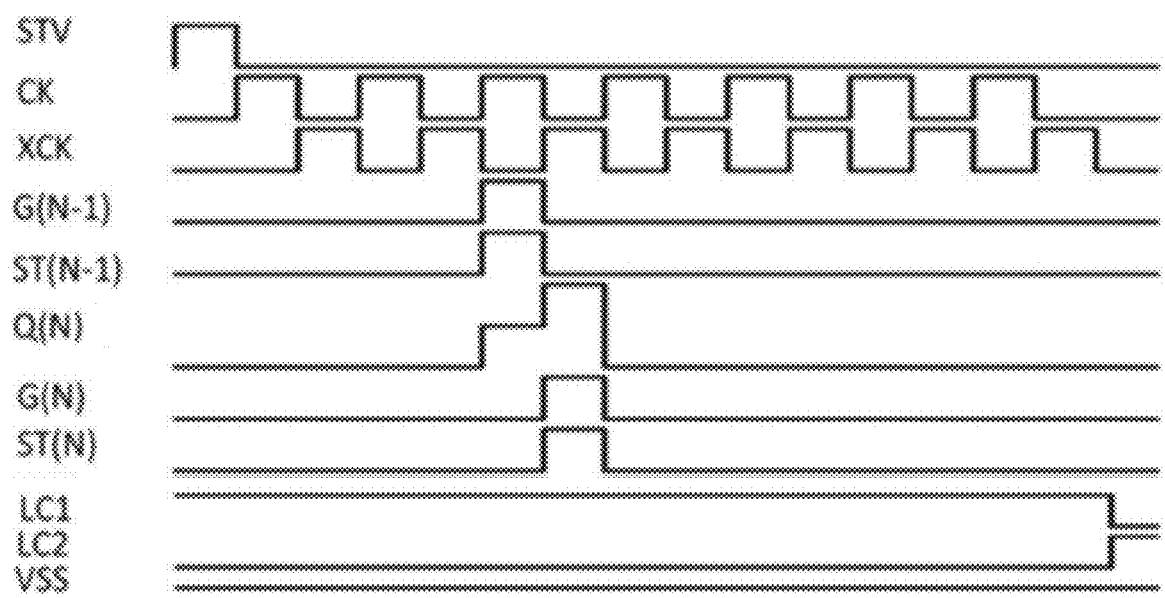
FIG. 4 schematically shows wave forms of signals during forward scanning of the gate drive circuit.

Wave forms of signals in the forward-scanning gate drive circuit are shown in FIG. 4. The starting signal STV is a starting signal for the entire gate drive circuit. The signal XCK which is in a direction opposite to the clock signal CK has a wave form opposite to that of the clock signal CK.

Based on the above analysis, it can be seen that the forward-scanning gate drive circuit can bring about the following beneficial effects.

The forward-scanning gate drive circuit in this embodiment realizes driving of a LCD panel through forward scanning, by way of which the LCD panel can realize normal display. Gate drive circuits in the prior art allows scanning only in a specific direction and are not able to support other drive modes. As the gate drive circuits in the prior art are provided with only one drive mode, LCD panels are restricted in use. The forward-scanning gate drive circuit provided in this embodiment enables a LCD panel to work normally under a forward scanning mode, which thus solves the above technical problem.

Compared with the existing structure, this embodiment only needs to change the connecting way of the output part and change the input signal and the output signal, by way of which signals flow from a high level to a low level and thus a forward drive of a LCD panel is realized. In this way, this embodiment realizes flexible drive of a LCD panel while widening the use thereof.

Embodiment 2

Figure 3:
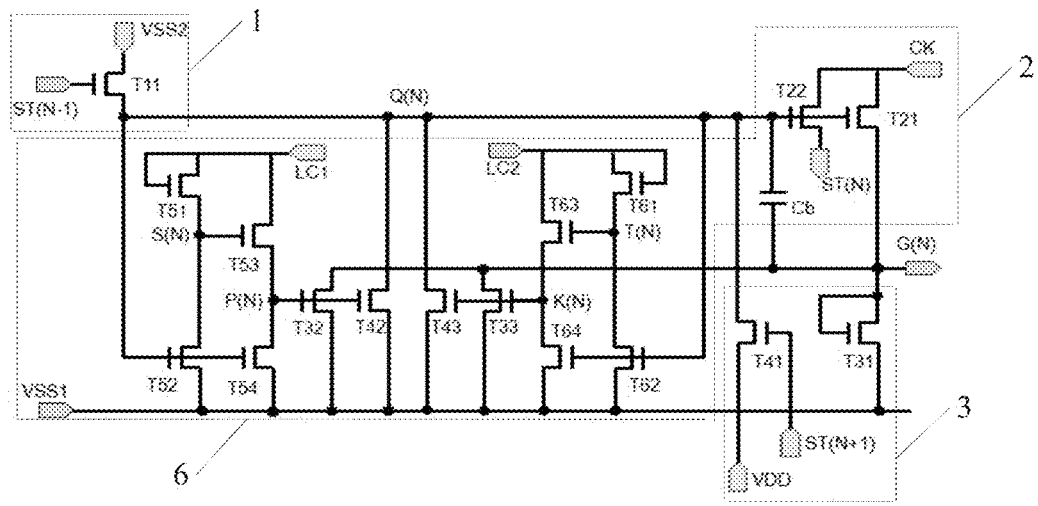
FIG. 3 schematically shows a gate drive circuit which realizes backward scanning of in Embodiment 2 of the present disclosure.

FIG. 3 schematically shows a gate drive circuit which realizes backward scanning in Embodiment 2 of the present disclosure. The backward-scanning gate drive circuit is used to provide a backward-scanning drive mode for a LCD panel. The backward-scanning gate drive circuit works on a LCD panel and enables the LCD panel to work normally under a backward scanning mode.

As shown in FIG. 3, the backward-scanning gate drive circuit in this embodiment comprises multiple stages of GOA units that are cascaded. A GOA unit in each stage drives a horizontal scanning line in a corresponding stage. In one preferred embodiment, GOA units in all stages in the backward-scanning gate drive circuit have a same structure.

Specifically, a GOA unit comprises an input part 1, a control part 2, and an output part 3.

A preferred structure of a gate drive circuit will be illustrated below with reference to the gate drive circuit which comprises the input part 1, the control part 2, and the output part 3.

A transfer signal of an $(N-1)^{th}$-stage GOA unit and a low-level direct-current signal are inputted into the input part 1 and a gate drive signal is finally outputted by the input part 1.

The gate drive signal outputted by the input part 1 is inputted into the control part 2. A transfer signal of an $N^{th}$-stage GOA unit is outputted from an output terminal of the control part 2. The control part 2, with a structure the same as the existing structure (i.e. the structure of an existing GOA circuit), comprises a pull-up part, a transfer part, a bootstrap capacitor, a key pull-down part, a first pull-down holding part, and a second pull-down holding part.

The output part 3 is configured to receive the gate drive signal, a transfer signal of an $(N+1)^{th}$-stage GOA unit, and a high-level direct-current signal, so as to realize driving of a horizontal scanning line in an $N^{th}$ stage.

Signals of the gate drive circuit in a backward scanning mode flow as follows: the transfer signal of the $(N+1)^{th}$-stage GOA unit→ the transfer signal of the $N^{th}$-stage GOA unit→ the transfer signal of the $(N-1)^{th}$-stage GOA unit, by way of which a backward drive mode of LCD panels is realized.

The working principle of the backward-scanning gate drive circuit in this embodiment will be illustrated below with reference to the backward-scanning gate drive circuit which comprises the input part 1, the control part 2, and the output part 3.

In order to drive a LCD device in a backward-scanning drive mode and to realize the backward drive mode of LCD panels by way of a flow of signals along the backward-scanning drive circuit as follows: the transfer signal SN(N+1) of the $(N+1)^{th}$-stage GOA unit→ the transfer signal SN(N) of the $N^{th}$-stage GOA unit→ the transfer signal SN(N−1) of the $(N-1)^{th}$-stage GOA unit, the following steps are required. A low-level signal is inputted into the input part 1. The transfer signal of the $(N+1)^{th}$-stage GOA unit is inputted into a gate of a switch element T41 in the output part 3 and a high-level direct-current signal is inputted into a source thereof. Besides, a gate and a source of a switch element T31 are both connected with the horizontal scanning line in the $N^{th}$ stage. By way of this, signals can flow from the high-level direct-current signal to the low-level direct-current signal and thus a backward scanning mode in which signals flow as follows is formed: the transfer signal SN(N+1) of the $(N+1)^{th}$-stage GOA unit → the transfer signal SN(N) of the $N^{th}$-stage GOA unit → the transfer signal SN(N−1) of the $(N−1)^{th}$-stage GOA unit.

Based on the above analysis, it can be seen that the backward-scanning gate drive circuit can bring about the following beneficial effects.

The backward-scanning gate drive circuit in this embodiment realizes driving of LCD panels through backward scanning, by way of which LCD panels can realize normal display. Gate drive circuits in the prior art allows scanning only in a specific direction and are not able to support other drive modes. As the gate drive circuits in the prior art are provided with only one drive mode, LCD panels are restricted in use. The backward-scanning gate drive circuit provided in this embodiment enables a LCD panel to work normally under a backward scanning mode, which thus solves the above technical problem.

Compared with the existing structure, this embodiment only needs to change the connecting way of the output part and change the input signal and the output signal, by way of which signals flow from a high level to a low level and thus a backward drive of a LCD panel is realized. In this way, this embodiment realizes flexible drive of a LCD panel while widening the use thereof.

Embodiment 3

A LCD panel in this embodiment is realized through the drive mode in Embodiment 1 or the drive mode in Embodiment 2. The circuit in Embodiment 1 or the circuit in Embodiment 2 can be used for providing a forward drive mode or a backward drive mode for the LCD panel. The two drive modes both work on the LCD panel, which enables the LCD panel to display normally under a forward or backward scanning mode.

LCD panels are widely used. Electronic products which are realized through application of the LCD panel in this embodiment are introduced below.

The LCD panel can be used in electronic devices with image display functions, such as, laptops, mobile phones, automobile control panels, temperature display panels, monitors, videophones, etc. As can be seen, the LCD panel can be widely used.

The LCD panel in this embodiment can bring about the following beneficial effects.

The LCD panel in this embodiment has two drive modes, a forward drive mode and a backward drive mode. The two drive modes enable the LCD panel to work normally under a forward scanning mode and a backward scanning mode, which makes the drive mode of the LCD panel not limited to one single type any longer. By way of this, flexible drive modes of a LCD panel are provided and use of a LCD panel is widened.

Although the present disclosure is described hereinabove with reference to specific embodiments, it can be appreciated that, these embodiments are merely examples illustrating the principles and applications of the present disclosure. It should therefore be appreciated that various modifications can be made to the embodiments, and other arrangements can be made, as long as they do not go beyond the spirit and scope of the present disclosure as defined by the appended claims. It should be understood that, different dependent claims and features described herein can be combined in a manner different from those described in the initial claims. It should also be understood that, the technical features described in one embodiment can also be used in other embodiments.

The invention claimed is:

1. A bidirectional scanning gate drive circuit, comprising multiple stages of GOA units that are cascaded, wherein a GOA unit in each stage is configured to drive a horizontal scanning line in a corresponding stage and wherein an $N^{th}$-stage GOA unit comprises:

an input part, configured to receive a transfer signal of an $(N-1)^{th}$-stage GOA unit, receive a high-level direct-current signal during forward scanning, receive a low-level direct-current signal during backward scanning, and output a gate drive signal;

a control part, configured to receive the gate drive signal and a clock signal, output a transfer signal of the $N^{th}$-stage GOA unit, and drive an $N^{th}$-stage horizontal scanning line, wherein the control part comprises a transfer part and a pull-up part, the transfer part comprises a thin film transistor (TFT) T22, and the pull-up part comprises a TFT T21, wherein the gate drive signal is input to a gate of the TFT T22 and a gate of the TFT T21, the clock signal is input to a source of the TFT T22 and a source of the TFT T21, the transfer signal of the $N^{th}$-stage GOA unit is output from a drain of the TFT T22, and the $N^{th}$-stage horizontal scanning line is connected with a drain of the TFT 21; and an output part, configured to receive the gate drive signal and a transfer signal of an $(N+1)^{th}$-stage GOA unit, receive a low-level direct-current signal during forward scanning, and receive a high-level direct-current signal during backward scanning, so as to drive the $N^{th}$-stage horizontal scanning line, wherein the output part comprises a switch element T41 and a switch element T31, wherein the transfer signal of the $(N+1)^{th}$-stage GOA unit is input to a gate of the switch element T41, the gate drive signal is input to a drain of the switch element T41, and the low-level direct-current signal is input to a source of the switch element T41 during forward scanning, the high-level direct-current signal is input to the source of the switch element T41 during backward scanning; another low-level direct-current signal is input to a source of the switch element T31, a gate of the switch element T31 is connected with a drain of the switch element T31 and the drain of the switch element T31 is further connected with the $N^{th}$-stage horizontal scanning line.

2. The bidirectional scanning gate drive circuit according to claim 1, wherein the control part further comprises a first pull-down holding part and a second pull-down holding part, and the first pull-down holding part and the second pull-down holding part are mirrored and configured to hold the $N^{th}$-stage horizontal scanning line in an off state.

3. The bidirectional scanning gate drive circuit according to claim 1, wherein the input part comprises a switch element T11, wherein:

a gate of the switch element T11 is connected with a transfer signal input terminal of the $(N-1)^{th}$-stage GOA unit and the transfer signal of the $(N-1)^{th}$-stage GOA unit is input to the gate of the switch element T11, a source of the switch element T11 is configured as a gate drive signal output terminal of the input part and configured to output the gate drive signal, and a drain of the switch element T11 is connected with a high-level direct-current signal input terminal and input with the high-level direct-current signal during forward scanning, and the drain of the switch element T11 is connected with a low-level direct-current signal input terminal and input with the low-level direct-current signal during backward scanning.

4. The bidirectional scanning gate drive circuit according to claim 1, wherein the switch element T41 and the switch element T31 are both metal-oxide-semiconductor field-effect transistors.

5. The bidirectional scanning gate drive circuit according to claim 3, wherein the switch element T11 is a metal-oxide-semiconductor field-effect transistor.

6. A liquid crystal display panel, comprising a bidirectional scanning gate drive circuit,
wherein the bidirectional scanning gate drive circuit comprises multiple stages of GOA units that are cascaded, wherein a GOA unit in each stage is configured to drive a horizontal scanning line in a corresponding stage and wherein an $N^{th}$-stage GOA unit comprises:
an input part, configured to receive a transfer signal of an $(N-1)^{th}$-stage GOA unit, receive a high-level direct-current signal during forward scanning, receive a low-level direct-current signal during backward scanning, and output a gate drive signal;
a control part, configured to receive the gate drive signal and a clock signal, output a transfer signal of the $N^{th}$-stage GOA unit, and drive an $N^{th}$-stage horizontal scanning line, wherein the control part comprises a transfer part and a pull-up part, the transfer part comprises a thin film transistor (TFT) T22, and the pull-up part comprises a TFT T21, wherein the gate drive signal is input to a gate of the TFT T22 and a gate of the TFT T21 the clock signal is input to a source of the TFT T22 and a source of the TFT T21, the transfer signal of the $N^{th}$-stage GOA unit is output from a drain of the TFT T22, and the $N^{th}$-stage horizontal scanning line is connected with a drain of the TFT 21; and
an output part, configured to receive the gate drive signal and a transfer signal of an $(N+1)^{th}$-stage GOA unit, receive a low-level direct-current signal during forward scanning, and receive a high-level direct-current signal during backward scanning, so as to drive the $N^{th}$-stage horizontal scanning line, wherein the output part comprises a switch element T41 and a switch element T31, wherein the transfer signal of the $(N+1)^{th}$-stage GOA unit is input to a gate of the switch element T41, the gate drive signal is input to a drain of the switch element T41, and the low-level direct-current signal is input to a source of the switch element T41 during forward scanning, the high-level direct-current signal is input to the source of the switch element T41 during backward scanning; another low-level direct-current signal is input to a source of the switch element T31, a gate of the switch element T31 is connected with a drain of the switch element T31, and the drain of the switch element T31 is further connected with the $N^{th}$-stage horizontal scanning line.

7. The liquid crystal display panel according to claim 6, wherein the control part further comprises a first pull-down holding part and a second pull-down holding part, and the first pull-down holding part and the second pull-down holding part are mirrored and configured to hold the $N^{th}$-stage horizontal scanning line in an off state.

8. The liquid crystal display panel according to claim 6, wherein the input part comprises a switch element T11, wherein:
a gate of the switch element T11 is connected with a transfer signal input terminal of the $(N-1)^{th}$-stage GOA unit and the transfer signal of the $(N-1)^{th}$-stage GOA unit is input to the gate of the switch element T11, a source of the switch element T11 is configured as a gate drive signal output terminal of the input part and configured to output the gate drive signal, and a drain of the switch element T11 is connected with a high-level direct-current signal input terminal and input with the high-level direct-current signal during forward scanning, and the drain of the switch element T11 is connected with a low-level direct-current signal input terminal and input with the low-level direct-current signal during backward scanning.

9. The liquid crystal display panel according to claim 6, wherein the switch element T41 and the switch element T31 are both metal-oxide-semiconductor field-effect transistors.

10. The liquid crystal display panel according to claim 8, wherein the switch element T11 is a metal-oxide-semiconductor field-effect transistor.

11. The liquid crystal display panel according to claim 6, wherein the bidirectional scanning gate drive circuit is configured to realize a forward scanning mode and a backward scanning mode, wherein:
while the bidirectional scanning gate drive circuit realizes a forward scanning mode, a flow of signals is as follows: the transfer signal of the $(N-1)^{th}$-stage GOA unit→the transfer signal of the $N^{th}$-stage GOA unit→the transfer signal of the $(N+1)^{th}$-stage GOA unit; and
while the bidirectional scanning gate drive circuit realizes a backward scanning mode, a flow of signals is as follows: the transfer signal of the $(N+1)^{th}$-stage GOA unit→the transfer signal of the $N^{th}$-stage GOA unit→the transfer signal of the $(N-1)^{th}$-stage GOA unit.

12. The liquid crystal display panel according to claim 7, wherein the bidirectional scanning gate drive circuit is configured to realize a forward scanning mode and a backward scanning mode, wherein:
while the bidirectional scanning gate drive circuit realizes a forward scanning mode, a flow of signals is as follows: the transfer signal of the $(N-1)^{th}$-stage GOA unit→the transfer signal of the $N^{th}$-stage GOA unit→the transfer signal of the $(N+1)^{th}$-stage GOA unit; and
while the bidirectional scanning gate drive circuit realizes a backward scanning mode, a flow of signals is as follows: the transfer signal of the $(N+1)^{th}$-stage GOA unit→the transfer signal of the $N^{th}$-stage GOA unit→the transfer signal of the $(N-1)^{th}$-stage GOA unit.

\* \* \* \* \*